(12) United States Patent
Sakurai (10) Patent No.: US 8,993,359 B2
(45) Date of Patent: Mar. 31, 2015

(54) METHOD FOR MANUFACTURING SEMICONDUCTOR OPTICAL DEVICE

(71) Applicant: Sumitomo Electric Industries, Ltd., Osaka-shi, Osaka (JP)

(72) Inventor: Kenji Sakurai, Toyama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 14/149,329

(22) Filed: Jan. 7, 2014

(65) Prior Publication Data

US 2014/0193933 A1    Jul. 10, 2014

(30) Foreign Application Priority Data

Jan. 8, 2013 (JP) .................................. 2013-001184

(51) Int. Cl.

| | | |
|---|---|---|
| H01L 21/00 | (2006.01) | |
| H01S 5/12 | (2006.01) | |
| H01S 5/227 | (2006.01) | |
| B82Y 20/00 | (2011.01) | |
| H01S 5/20 | (2006.01) | |
| H01S 5/22 | (2006.01) | |
| H01S 5/343 | (2006.01) | |

(52) U.S. Cl.
CPC ............. *H01S 5/1231* (2013.01); *H01S 5/2275* (2013.01); *B82Y 20/00* (2013.01); *H01S 5/2081* (2013.01); *H01S 5/2222* (2013.01); *H01S 5/34306* (2013.01); *H01S 2301/176* (2013.01)

USPC ............................................................. 438/32

(58) Field of Classification Search
USPC ............ 438/29, 31, 32, 947; 359/569; 257/98
See application file for complete search history.

(56) References Cited

U.S. PATENT DOCUMENTS

| 7,977,129 | B2* | 7/2011 | Tsuji ................................ 438/32 |
| 2005/0069732 | A1* | 3/2005 | Kamata et al. ........... 428/694 TC |
| 2011/0075260 | A1* | 3/2011 | Shibayama et al. ........... 359/576 |
| 2011/0306155 | A1* | 12/2011 | Tsuji ................................ 438/32 |

FOREIGN PATENT DOCUMENTS

JP      2010-272694      12/2010

* cited by examiner

*Primary Examiner* — Mary Wilczewski
*Assistant Examiner* — Erik T Peterson
(74) *Attorney, Agent, or Firm* — Smith, Gambrell & Russell LLP (57) ABSTRACT

A method for manufacturing a semiconductor optical device includes the steps of preparing a mold having an imprint pattern; forming a substrate product including a semiconductor layer; forming a first resin layer on the semiconductor layer; forming a diffraction grating pattern having periodic projections and recesses in the first resin layer using the mold, the projection of the diffraction grating pattern having a top portion and a base portion; changing a duty ratio of the diffraction grating pattern by dry-etching the first resin layer; forming a second resin layer on the first resin layer so as to cover the projection and the recess; removing the top portion by etching back the first and second resin layers; and selectively etching the first resin layer so as to have a reverse pattern to the diffraction grating pattern; and etching the semiconductor layer through the first resin layer.

9 Claims, 11 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device.

2. Description of the Related Art

Japanese Unexamined Patent Application Publication No. 2010-272694 (Patent literature 1) discloses a method for fabricating a semiconductor optical device, in which different diffraction gratings can be formed by nanoimprint lithography without creating any dead area. The method for fabricating a semiconductor optical device according to Patent literature 1 uses a mold having a pattern surface including a plurality of pattern portions. The pattern portions are arranged at the period corresponding to the device size. At least one of the pattern portions differs from the other pattern portions. Using this mold, a first mask is formed on a semiconductor region by nanoimprint lithography. The semiconductor region is etched through the first mask to form a plurality of periodic structures corresponding to different pattern portions in the semiconductor region. A second mask having first and second patterns is formed on first and second desired periodic structures, respectively, in different device segments. The second mask is used to form first and second stripe mesas in the first and second segments, respectively.

SUMMARY OF THE INVENTION

Distributed feedback laser diodes (DFB-LDs) are used for Long-distance optical communication systems as light sources. The use of phase-shift diffraction gratings with DFB-LDs improves the yield of single longitudinal mode oscillation. Although electron beam lithography has been used to form diffraction gratings in the related art, nanoimprint lithography can be used for improved throughput.

In a nanoimprint lithography method, a mold is used to transfer (imprint) the pattern to a semiconductor layer. To form the diffraction grating on the semiconductor layer, the mold on which a grating pattern having a predetermined pitch and duty ratio is formed is prepared in advance. To fabricate many types of optical devices including different grating patterns, it is generally necessary to prepare a plurality of molds corresponding to the individual grating patterns for fabricating the individual optical devices. This increases the costs for mold fabrication and management. In contrast, the method disclosed in Patent literature 1 uses a mold having a plurality of pattern portions arranged at the period corresponding to the device size. This method allows many types of optical devices to be fabricated using a single mold. However, the total number of patterns that can be formed in an area of a single device size is limited because the device size and the diffraction grating size are limited. Thus, in the area of the single device size, the number of pitches at which patterns can be formed is inversely proportional to the number of duty ratios at which patterns are formed. For example, if the total number of patterns that can be formed in the area of the single device size is n, and the number of duty ratios for each pitch is m, then the maximum number of pitches at which patterns can be formed is n/m (where m and n are natural numbers). The duty ratio of a diffraction grating is a parameter directly related to the coupling coefficient κ of the diffraction grating. The coupling coefficient κ is a parameter closely related to lasing characteristics such as a threshold current, a yield of single longitudinal mode operation, and high frequency characteristics. If the duty ratio of a diffraction grating deviates from the design duty ratio, the yield of laser devices decreases.

In Patent literature 1, the duty ratio of a diffraction grating that can be formed in a semiconductor layer is determined by a pattern of a mold. Therefore, the pattern of the mold needs to be fabricated to the design dimensions. Because nanoimprint lithography is a 1× magnification transfer process, the dimensional precision of the diffraction grating formed in the semiconductor layer is nearly equal to the precision of the pattern formed on the pattern surface of the mold. For example, if the oscillation wavelength of a DFB-LD is 1.3 µm, the pitch of the diffraction grating is about 200 nm. If the groove width of the grating pattern formed on the pattern surface of the mold deviates from the design width by 10 nm, the duty ratio of the diffraction grating varies by 5%. Such a deviation in the duty ratio of the diffraction grating cannot be ignored because it affects the laser oscillation characteristics and the device yield. It is difficult, however, to form a mold pattern with a dimensional precision of within ±10 nm with respect to the design width. A diffraction grating with the design duty ratio can be fabricated, for example, by forming diffraction gratings using a plurality of molds and selecting a diffraction grating having the desired duty ratio therefrom. It is also possible to increase the number of duty ratios at which patterns are formed in advance, making allowance for a dimensional error. These methods, however, require a plurality of expensive molds to be prepared and also decrease the number of laser devices that can be manufactured from a single wafer, thus increasing the manufacturing costs.

Accordingly, a method for manufacturing a semiconductor optical device according to the present invention includes the steps of (a) preparing a mold having an imprint pattern including periodic projections and recesses; (b) forming a substrate product including a semiconductor layer that extends along a reference plane; (c) forming a first resin layer on the semiconductor layer; (d) forming a diffraction grating pattern having periodic projections and recesses in the first resin layer by transferring the imprint pattern using the mold by nanoimprint lithography, the projection of the diffraction grating pattern having a top portion and a base portion; (e) changing a duty ratio of the diffraction grating pattern in the first resin layer by dry-etching the first resin layer; (f) forming a second resin layer on the first resin layer so as to cover the projection and the recess of the diffraction grating pattern in the first resin layer; (g) removing the top portion of the projection of the diffraction grating pattern by etching back the first resin layer and the second resin layer while leaving the base portion of the projection, the second resin layer being left in the recess of the first resin layer; (h) selectively etching the first resin layer through the second resin layer left in the recess of the first resin layer, the first resin layer having a reverse pattern to the diffraction grating pattern; and (i) etching the semiconductor layer through the first resin layer having the reverse pattern to the diffraction grating pattern to form a diffraction grating.

In the method for manufacturing a semiconductor optical device according to the present invention, the duty ratio of the diffraction grating pattern in the first resin layer is adjusted. Therefore, even if the mold has a single duty ratio, the diffraction grating patterns having different duty ratios can be achieved. If the mold has a single duty ratio, it can be designed to have more pitches than a mold having a plurality of duty ratios. Whereas the methods in the related art require a plurality of molds to be prepared depending on the types of duty ratios and pitches of imprint patterns for forming diffraction gratings, the method according to the present invention requires a fewer molds or a single mold with a fewer duty ratios to be prepared as compared to the methods in the related art. This reduces the cost for mold fabrication. The method according to the present invention also allows design changes because, for example, the duty ratio of a diffraction grating formed in a semiconductor layer can be adjusted irrespective of the duty ratio of the imprint pattern formed on the mold.

In the method for manufacturing a semiconductor optical device according to the present invention, in the step of removing the top portion of the projection, the base portion of the projection may include an end surface disposed between the base portion and the top portion and a side surface. The side surface may have a region adjacent to the end surface that extends substantially perpendicular to the reference plane. The first resin layer and the second resin layer are etched back until the top portion, which has a curved surface, is removed, and the base portion having the side surface perpendicular to the reference plane, remain. Thus, the end surfaces of the base portions have a uniform width. Because the diffraction grating is defined by the side surfaces, the base portions, having a uniform width, allow the diffraction grating to have a sufficiently uniform pitch.

The method for manufacturing a semiconductor optical device according to the present invention may further include a step of forming an insulating layer on the semiconductor layer. The first resin layer is preferably formed on the insulating layer. In addition, in the step of forming the diffraction grating pattern in the first resin layer, the diffraction grating pattern has a height measured from a bottom surface of the recess to a surface of the insulating layer, the height being larger than a thickness by which the first resin layer is etched in the step of changing the duty ratio of the diffraction grating pattern. After the duty ratio is adjusted, the resin layer remains at least partially on the insulating layer. Thus, the height of the projections after the adjustment of the duty ratio is similar to the height of the projections before the adjustment of the duty ratio. When used as a mask, therefore, the resin layer functions well as a mask.

In the method for manufacturing a semiconductor optical device according to the present invention, the first resin layer may be composed of a resin containing no silicon. The second resin layer may be composed of a resin containing silicon. In addition, in the step of selectively etching the first resin layer, the first resin layer may be etched by reactive ion etching with a gas mixture of tetrafluoromethane ($CF_4$) gas and oxygen ($O_2$) gas. Furthermore, the step of removing the top portion of the projection and the step of selectively etching the first resin layer may be continuously performed by changing a mixing ratio of the $CF_4$ gas to the $O_2$ gas in the gas mixture.

The method for manufacturing a semiconductor optical device according to the present invention may further include a step of forming an insulating layer on the semiconductor layer. The first resin layer may be formed on the insulating layer. In the step of selectively etching the first resin layer, the first resin layer may be etched until the insulating layer is exposed. The insulating layer may be etched using the first resin layer having the reverse pattern to the diffraction grating pattern as a mask. In addition, after removing the first resin layer, the semiconductor layer may be etched using the insulating layer as a mask in the step of etching the semiconductor layer.

In the method for manufacturing a semiconductor optical device according to the present invention, in the step of changing the duty ratio of the diffraction grating pattern, the first resin layer is preferably dry-etched by reactive ion etching using $O_2$ gas as an etching gas.

In the method for manufacturing a semiconductor optical device according to the present invention, the imprint pattern of the mold preferably includes a plurality of grating patterns having different pitches, the grating patterns having a single duty ratio.

The method for manufacturing a semiconductor optical device according to the present invention may further include a step of forming a lower cladding layer, an active layer, and an upper cladding layer on the diffraction grating formed in the semiconductor layer after the step of etching the semiconductor layer.

DESCRIPTION OF THE PREFERRED EMBODIMENTS

Preferred embodiments of the present invention will now be described in detail with reference to the drawings. To avoid redundancy in the description of the drawings, like elements are provided with like reference numerals where possible.

Figure 1:
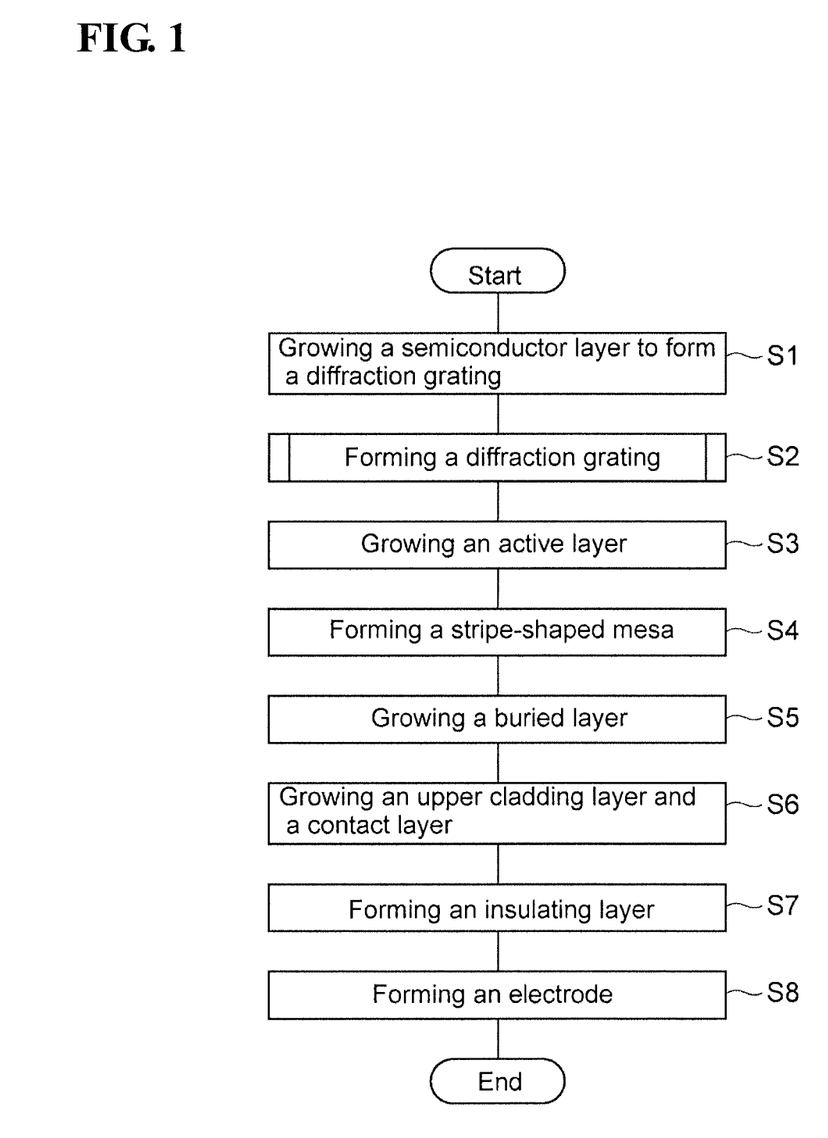
FIG. 1 illustrates the main steps of a method of manufacture according to an embodiment.
Figure 2:
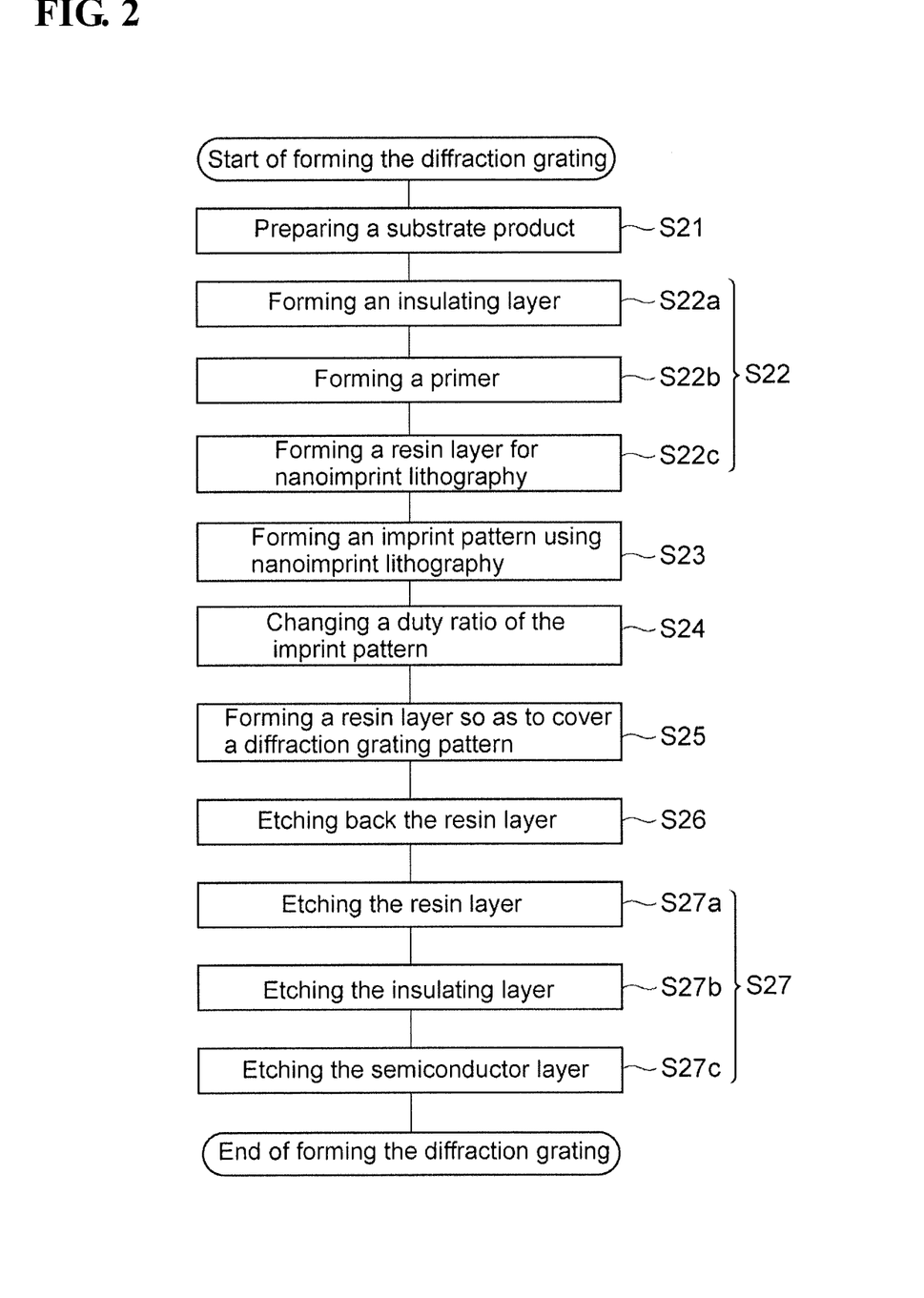
FIG. 2 illustrates a detailed step of forming a diffraction grating in the method of manufacture according to the embodiment.

FIG. 1 shows the main steps of a method for manufacturing a semiconductor laser device according to an embodiment. The main part of the semiconductor laser device is manufactured according to the flowchart shown in FIG. 1. FIG. 2 specifically shows a detailed step of forming a diffraction grating among the steps shown in FIG. 1. FIGS. 3A to 10B illustrate the steps in the method for manufacturing the semiconductor laser device as shown in FIGS. 1 and 2. FIGS. 3A to 7B show the internal structure of a product as viewed in a direction (y-axis direction) perpendicular to the direction (x-axis direction) in which the waveguide of the semiconductor laser device according to this embodiment extends. FIGS.

8A to 10B show the internal structure of the product as viewed in the direction (x-axis direction) in which the waveguide extends. A semiconductor laser device 50 according to this embodiment is an example of a semiconductor optical device. The semiconductor laser device 50 according to this embodiment has the internal structure shown in FIG. 10B. FIG. 10B shows the internal structure of the semiconductor laser device 50 as viewed in the waveguide direction.

Figure 3A:
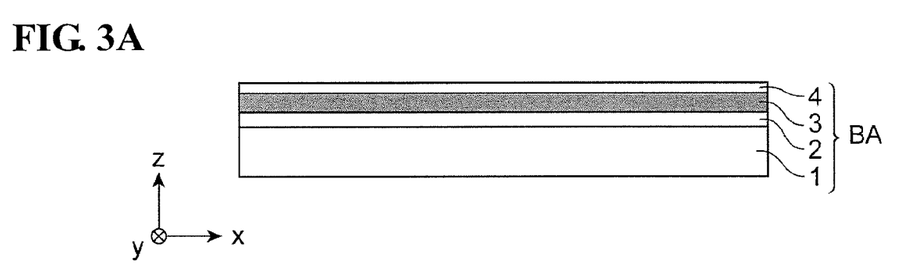
FIGS. 3A to 3C show the internal structure of a product manufactured by the method of manufacture according to the embodiment.

Referring now to FIG. 3A, step S1 in FIG. 1 will be described. In step S1, a semiconductor layer 3 in which a diffraction grating is to be formed is grown. By step S1, a substrate product BA shown in FIG. 3A is manufactured. The substrate product BA includes a substrate 1, a buffer layer 2, the semiconductor layer 3, and a capping layer 4. The buffer layer 2, the semiconductor layer 3, and the capping layer 4 are epitaxially grown in this order on a surface of the substrate 1. The substrate 1 is made of, for example, n-type InP. The buffer layer 2 is made of, for example, n-type InP. The semiconductor layer 3 is made of, for example, n-type InGaAsP. The capping layer 4 is method of, for example, the same material as the buffer layer 2, i.e., n-type InP.

Figure 3B:
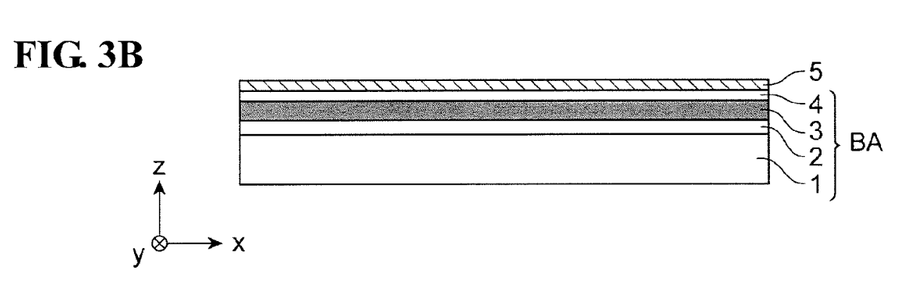

Referring now to FIGS. 2 and 3B to 8A, step S2 in FIG. 1 will be described. As shown in FIG. 2, step S2 includes steps S21 to S27. Step S22 includes steps S22a to S22c. Step S27 includes steps S27a to S27c. In step S21, the substrate product BA is provided. The substrate product BA includes the semiconductor layer 3 in which a diffraction grating is to be formed. After step S21, in step S22, a resin layer 7 (first resin layer) is provided on the semiconductor layer 3. The resin layer 7 is used for forming an imprint pattern thereon by using nanoimprint lithography. In step S22a, as shown in FIG. 3B, an insulating layer 5 is formed on the surface of the capping layer 4. The insulating layer 5 is made of, for example, a SiN film. The insulating layer 5 has a thickness of, for example, about 50 nm.

Figure 3C:
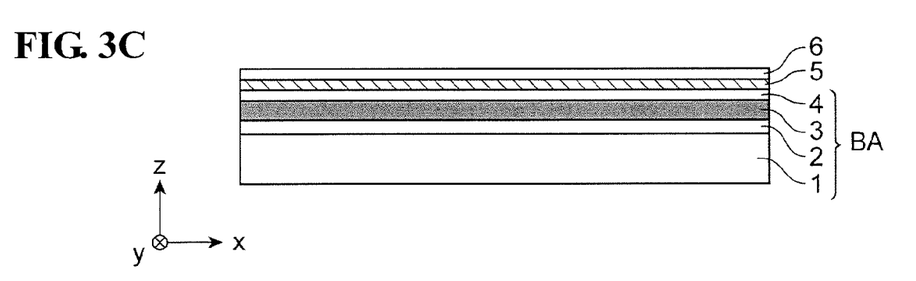

After step S22a, in step S22b, as shown in FIG. 3C, a primer 6 is formed on the surface of the insulating layer 5. The primer 6 is formed to improve the adhesive properties between the insulating layer 5 and the resin layer 7, described later. The primer 6 has a thickness of, for example, about 100 nm. The primer 6 can be made of, for example, a novolac resin such as DUV-40, produced by Brewer Science, Inc.

Figure 4A:
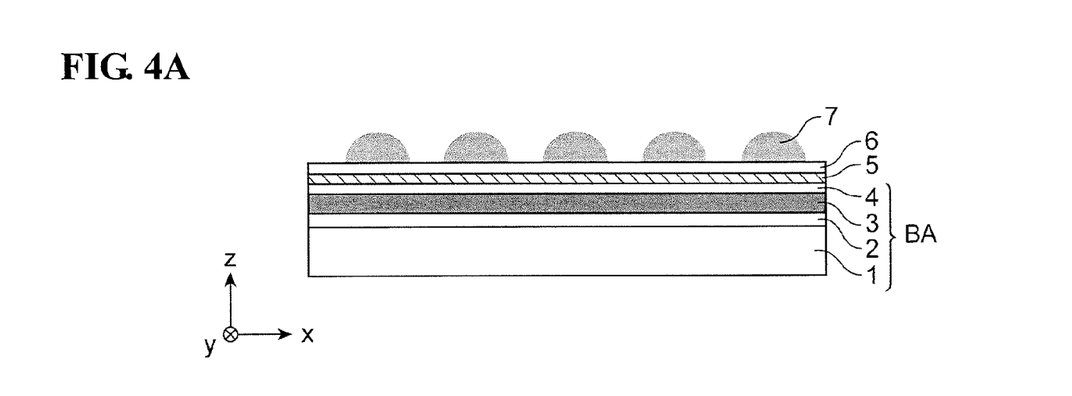
FIGS. 4A and 4B show the internal structure of the product manufactured by the method of manufacture according to the embodiment.

After step S22b, in step S22c, as shown in FIG. 4A, the resin layer 7 is formed. The resin layer 7 is formed by applying a resin to a wafer using a resin dispenser. The resin layer 7 may also be formed using a spin coater. The resin layer 7 is made of a resin containing no silicon. For example, the resin layer 7 is made of an acrylic ultraviolet (UV) curing resin.

Figure 4B:
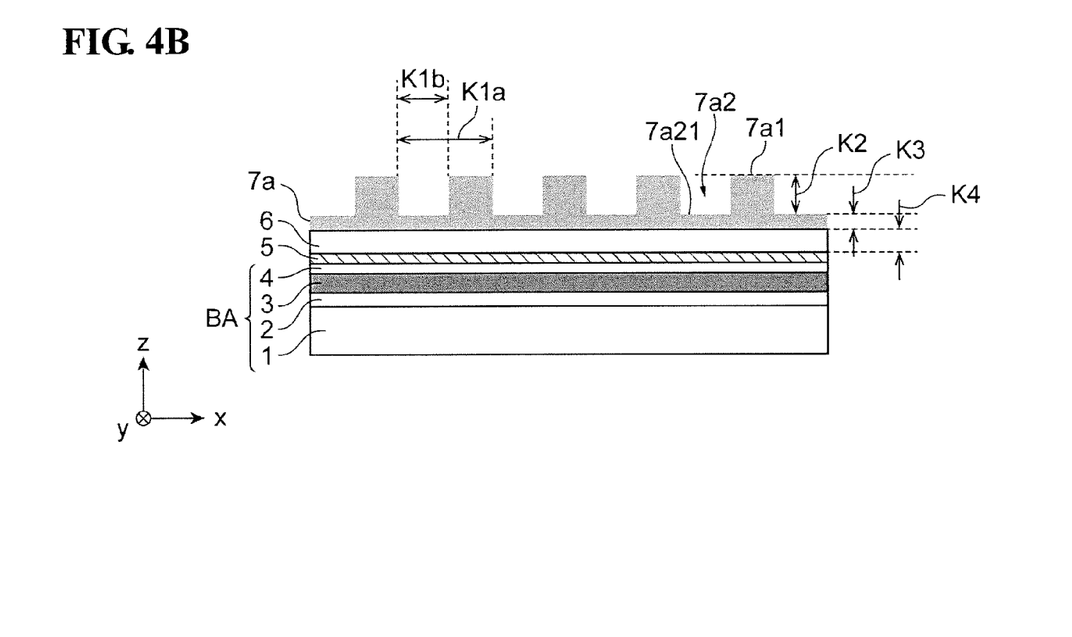
Figure 11A:
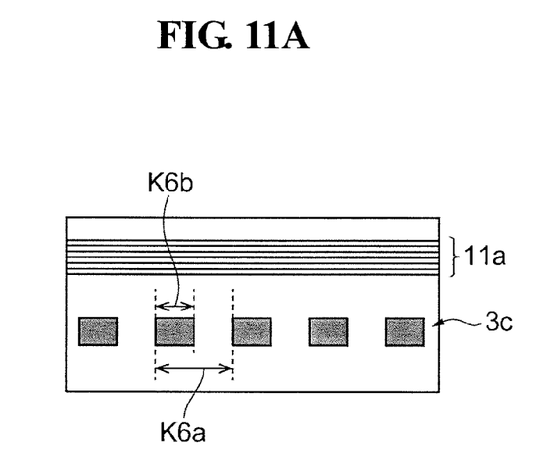
FIG. 11A illustrates the duty ratio of a diffraction grating according to the embodiment.
Figure 11B:
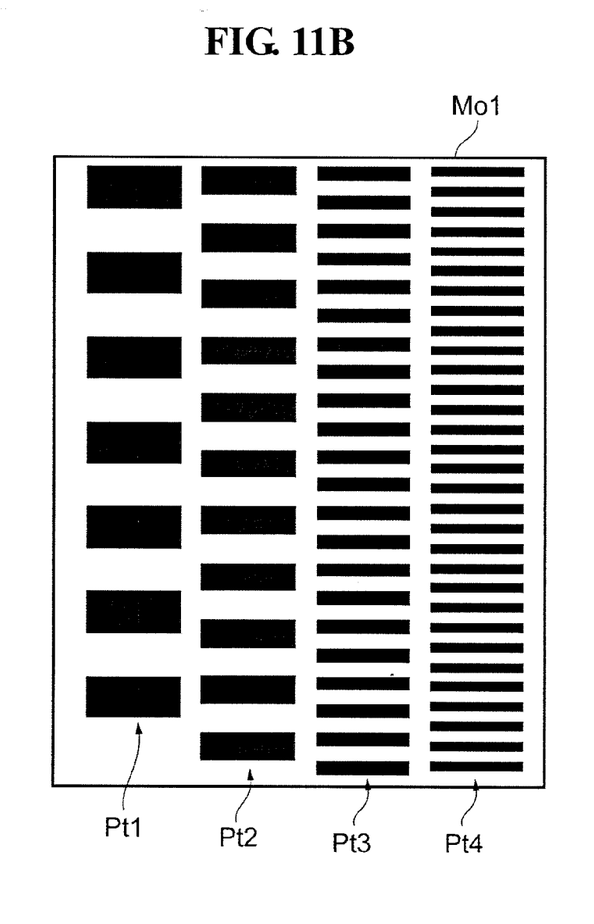
FIG. 11B shows an example of a mold used in the method of manufacture according to the embodiment.

After step S22, in step S23, as shown in FIG. 4B, an imprint pattern is formed on the resin layer 7 by using a mold Mo shown in FIG. 11B. The mold Mo includes imprint patterns Pt1 to Pt4 for forming diffraction gratings. In step S23, at least one of the imprint patterns Pt1 to Pt4 including in the mold Mo is transferred to the resin layer 7 using nanoimprint lithography. By this step, for example, a resin layer 7a having the imprint pattern Pt1 is formed. The mold Mo shown in FIG. 11B has four imprint patterns, i.e., the imprint patterns Pt1 to Pt4. The imprint patterns Pt1 to Pt4 have the same duty ratio. Even if the mold Mo has a plurality of imprint patterns with a single duty ratio, the method of manufacture according to this embodiment may be used to form diffraction grating layers with different duty ratios. The maximum number of pitches, which is the number of imprint patterns divided by the number of duty ratios, is four in this embodiment. Thus, imprint patterns with a relatively large number of pitches are formed on the single mold Mo. Although step S23 illustrates the case where the imprint pattern Pt1 is imprinted on the resin layer 7, the mold Mo may be used to simultaneously imprint all imprint patterns Pt1 to Pt4 on the resin layer 7.

The resin layer 7a has a plurality of projections 7a1 and a plurality of recesses 7a2. The diffraction grating pattern transferred to the resin layer 7a is the inverse pattern of the imprint pattern Pt1 formed on the mold Mo. The projections 7a1 and the recesses 7a2 are arranged alternately at a predetermined period along the x-axis. The pitch K1a of the imprint pattern Pt1 is the sum of the width (in the x-axis direction) of the projections 7a1 and the width K1b (in the x-axis direction) of the recesses 7a2. The duty ratio of the imprint pattern Pt1 is the width K1b divided by the pitch K1a. The height from the bottom surfaces 7a21 of the recesses 7a2 of the imprint pattern Pt1 to the insulating layer 5 is the sum of a thickness K3 and a thickness K4. This height is larger than the thickness K5 by which the resin layer 7a is etched in step S24, described later. Thus, after the resin layer 7a is etched in step S24, the primer 6, which is made of a resin, remains partially or completely between the adjacent projections 7a1. The height K2 of the projections 7a1, which extend from the bottom surfaces 7a21 of the recesses 7a2, is, for example, about 200 nm. The thickness K3 of the recesses 7a2 is, for example, about 70 nm. The thickness K4 of the primer 6 is, for example, about 100 nm. The pitch K1a is, for example, about 200 nm.

Figure 5A:
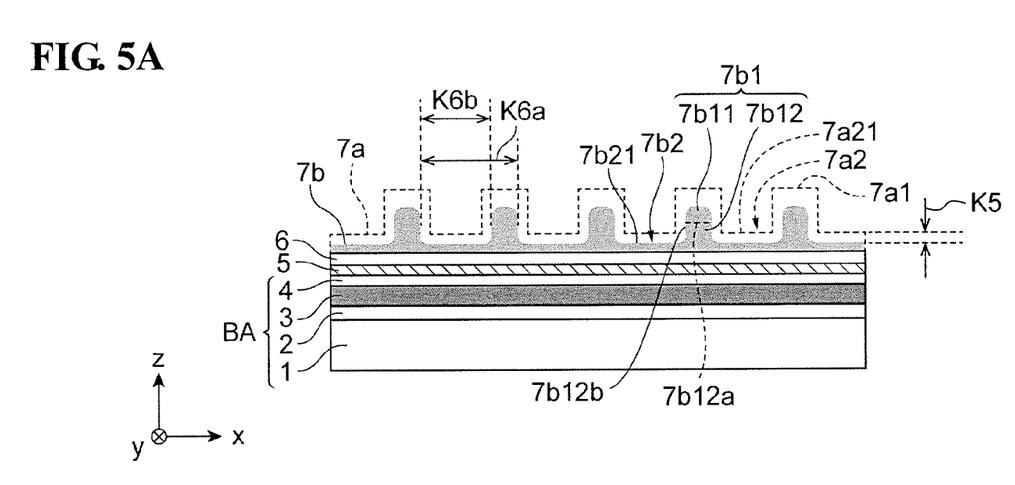
FIGS. 5A and 5B show the internal structure of the product manufactured by the method of manufacture according to the embodiment.

After step S23, in step S24, as shown in FIG. 5A, the surface of the resin layer 7a is uniformly dry-etched with a plasma containing $O_2$ gas by the thickness K5. By this dry etching process, the duty ratio of the imprint pattern Pt1 is changed. Thus, a resin layer 7b having a diffraction grating pattern with a different duty ratio is formed. The thickness K5 by which the resin layer 7a is dry-etched is a distance measured from the bottom surfaces 7a21 of the recesses 7a2 of the imprint pattern Pt1 to the bottom surfaces 7b21 of recesses 7b2 of the diffraction grating pattern of the resin layer 7b. The resin layer 7b has a plurality of projections 7b1 and a plurality of recesses 7b2. The projections 7b1 and the recesses 7b2 are arranged alternately at a predetermined period along the x-axis. The diffraction grating pattern of the resin layer 7b is composed of the projections 7b1 and the recesses 7b2. The period at which the projections 7b1 and the recesses 7b2 are arranged along the x-axis is nearly the same as the period at which the projections 7a1 and the recesses 7a2 of the imprint pattern Pt1 are arranged. Each projection 7b1 includes a top portion 7b11 and a base portion 7b12. After etching the resin layer 7a in the dry etching process, the surface of the top portion 7b11 is curved, and the shape of the top portion 7b11 is generally semicircular as viewed in the y-axis direction. The top portion 7b11 is formed on an end surface 7b12a of the base portion 7b12. The base portion 7b12 has side surfaces 7b12b that extend along a plane perpendicular to the x-y plane and that are generally perpendicular to the x-y plane. The base portion 7b12 extends above the bottom surfaces 7b21 of the recesses 7b2 as viewed in the y-axis direction and has an elongated, generally rectangular shape above the bottom surfaces 7b21. The pitch K6a of the diffraction grating pattern of the resin layer 7b is the sum of the width (in the x-axis direction) of the projections 7b1 and the width K6b (in the x-axis direction) of the recesses 7b2. The duty ratio of the resin layer 7b is the width K6b divided by the pitch K6a. As described later, the recesses 7b2 of the resin layer 7b correspond to projections between adjacent through-holes 3a1 in a semiconductor layer 3a (see FIG. 7B). The height of the projections 7b1, which extend from the bottom surfaces 7b21 of the recesses 7b2, is similar to the height K2 of the projections 7a1. As previously described, the pitch K6a is similar to the pitch K1a of the imprint pattern Pt1. However, the width K6b of the diffraction grating pattern of the resin layer 7b is larger than the width K1b of the imprint pattern Pt1. Hence, the duty ratio of the diffraction grating pattern of the resin layer 7b is larger than the duty ratio of the imprint pattern Pt1.

An example of the dry etching process in step S24 is illustrated below. The dry etching process uses an inductively coupled plasma reactive ion etching (ICP-RIE) equipment. The internal pressure of the chamber is set to be about 2 Pa. The ICP-RIE equipment includes two electrodes that are a coil electrode for generating plasma and a substrate electrode, each having a high-frequency power supply connected thereto. By supplying high-frequency power (ICP power) to the coil electrode, a high-density plasma is generated. This allows the etching rate to be readily controlled. By supplying high-frequency power (bias power) to the substrate electrode, ions and radicals in the plasma are attracted to the etching target. In etching using the ICP-RIE equipment, the bias power can be controlled independently of the ICP power for generating plasma. In addition, by adjusting the bias power, the bias voltage for attracting ions and radicals can be set to a relatively low level so that the etching target suffers less physical damage. In this embodiment, the ICP power is set to be the range of 10 to 300 W. The bias power is set to be the range of nearly 0 (zero) to 100 W. The etching rate is adjusted to the range of 2 to 60 nm/min. The flow rate of the $O_2$ gas used as an etching gas is about 80 sccm. The etching time is set to be 1 to 10 minutes. After the dry etching process in step S24, the difference between the width (in the x-axis direction) of the projections 7a1 (the value that subtracted the width K1b from the pitch K1a) and the width (in the x-axis direction) of the projections 7b1 (the value that subtracted the width K6b from the pitch K6a) is, for example, several nanometers to 100 nm.

Figure 5B:
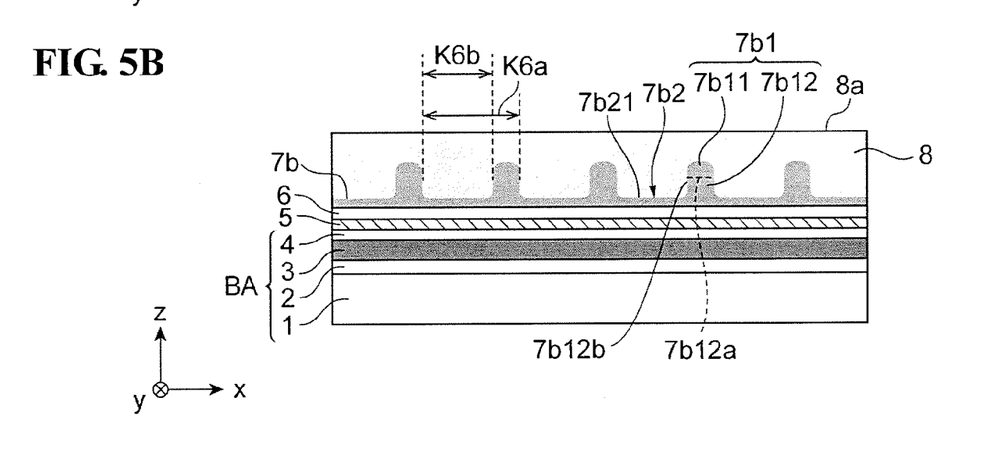

After step S24, in step S25, as shown in FIG. 5B, a resin layer 8 (second resin layer) is formed on the resin layer 7b so as to cover the diffraction grating pattern of the resin layer 7b. The resin layer 8 has a flat surface 8a extending along the x-y plane. The resin layer 8 is formed, for example, by spin coating. The resin layer 8 is made of, for example, a resin containing silicon, such as an organic silicon compound.

Figure 6A:
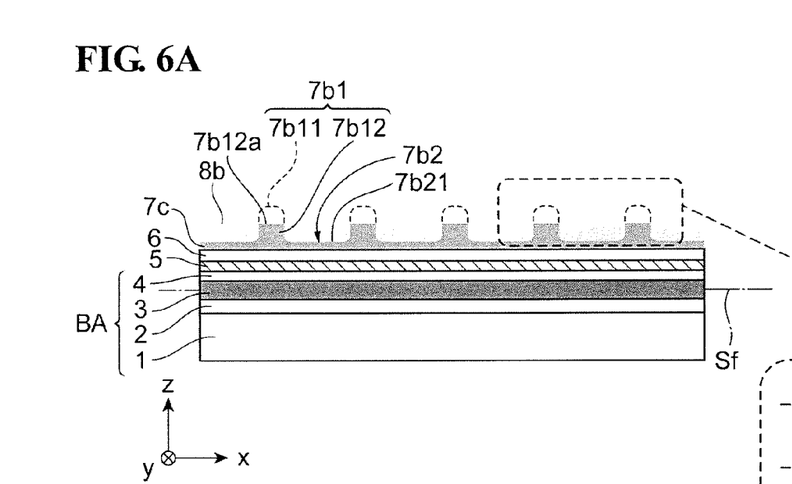
FIGS. 6A to 6C show the internal structure of the product manufactured by the method of manufacture according to the embodiment.

After step S25, in step S26, as shown in FIG. 6A, the resin layers 8 and 7b are etched back from the surface 8a of the resin layer 8 toward the resin layer 7b. By this etch-back process, the top portions 7b11 of the projections 7b1 of the diffraction grating pattern of the resin layer 7b are removed while leaving the base portions 7b12 of the projections 7b1. The etched back resin layer 8 forms a resin layer 8b, and the etched back resin layer 7b forms a resin layer 7c. The resin layer 7c has the base portions 7b12. The end surfaces 7b12a of the base portions 7b12 are flush with the surface of the resin layer 8b. At least the regions of the side surfaces 7b12b adjacent to the end surfaces 7b12a of the base portions 7b12 extend substantially perpendicular to a reference plane Sf along which the semiconductor layer 3 extends. The reference plane Sf is parallel to the x-y plane.

An example of the etch-back process is illustrated below. In this etch-back process, a dry etching method such as RIE is used. A gas mixture of $CF_4$ gas and $O_2$ gas is used as an etching gas. The internal pressure of the chamber is set to be 1 to 5 Pa. The ICP power is set to be 200 to 300 W. The flow rate of the $CF_4$ gas is set to be 50 to 100 sccm. The flow rate of the $O_2$ gas is set to be 0.5 to 5 sccm.

Figure 6B:
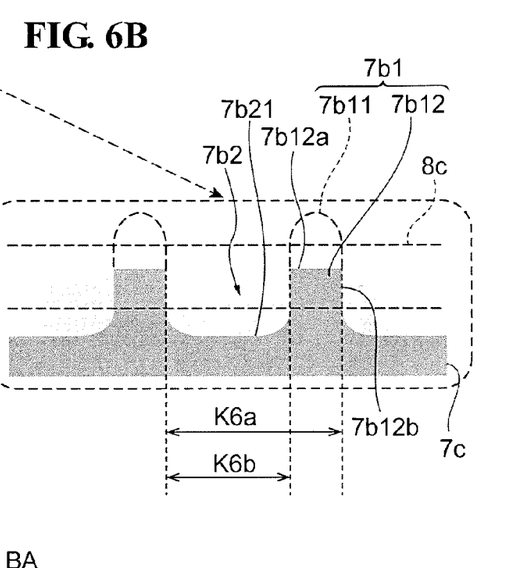

As shown in FIG. 6B, if the etch-back process is terminated before reaching the base portions 7b 12, the etching depth is set to be smaller than the etching depth in step S26. In this case, a virtual surface 8c formed by the etch-back process crosses the top portions 7b11, which have curved surfaces. As a result, the width K7 (in the x-axis direction) of the surfaces of the projections 7b1 of the resin layer 7b formed by the etch-back process is not uniform. Consequently, the pitch of the diffraction grating varies. In contrast, as described above, in the etch-back process in step S26, the resin layers 8 and 7b are etched back until the top portions 7b11 having curved surfaces are removed. As a result, the base portions 7b12, which have the side surfaces 7b12b generally perpendicular to the reference plane Sf, remain, and therefore, the width (in the x-axis direction) of the end surfaces 7b12a of the base portions 7b12 is uniform. Accordingly, the pitch of the diffraction grating is uniform.

Figure 6C:
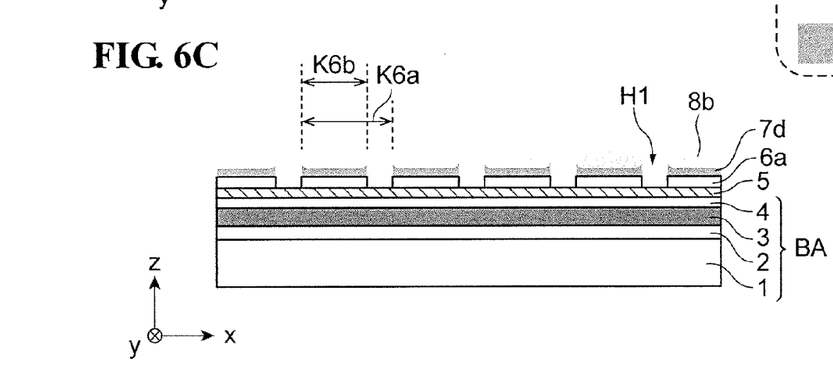
Figure 7A:
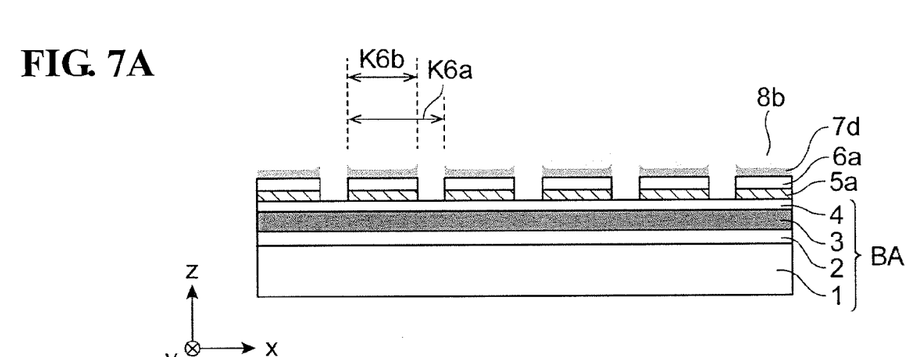
FIGS. 7A and 7B show the internal structure of the product manufactured by the method of manufacture according to the embodiment.
Figure 7B:
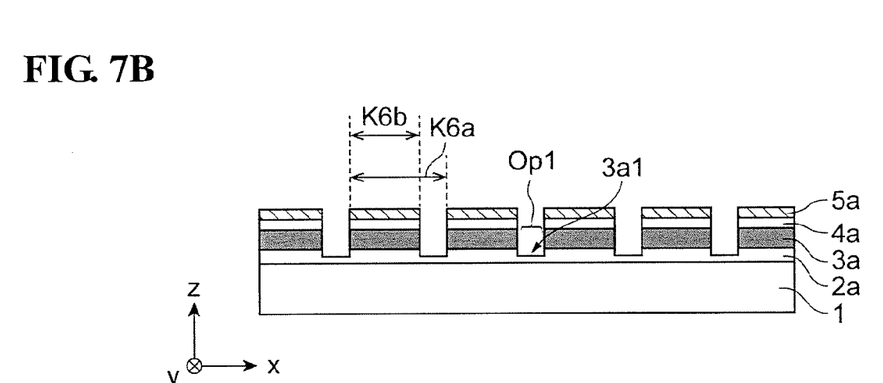

After step S26, in step S27, as shown in FIG. 6C, the layers from the resin layer 7c to the semiconductor layer 3 are sequentially dry-etched from the end surfaces 7b12a of the base portions 7b12 toward the semiconductor layer 3 to form through-holes 3a1 in the semiconductor layer 3 (see FIGS. 7A and 7B). Thus, a diffraction grating is formed in the semiconductor layer 3. The dry-etched semiconductor layer 3 forms a semiconductor layer 3a. The semiconductor layer 3a has the through-holes 3a1. The semiconductor layer 3a has a diffraction grating.

An example of the dry etching process in step S27 is illustrated below. In this dry etching process, RIE is used, for example.

As shown in FIG. 6C, in step S27a, the base portions 7b12 and the primer 6 are selectively dry-etched to form recesses H1. The insulating layer 5 is exposed in the recesses H1. The etching gas used in the dry etching process is a gas mixture of $CF_4$ gas and $O_2$ gas. The mixing ratio of the $CF_4$ gas to the $O_2$ gas in the gas mixture can be adjusted so that the etching rate of the resin layer 7c, which is made of a resin containing no silicon, and the primer 6 is higher than the etching rate of the resin layer 8, which is made of a resin containing silicon. Thus, the base portions 7b12 of the resin layer 7c, which is made of a resin containing no silicon, and the primer 6 can be selectively etched. By this etching process, the base portions 7b12 of the resin layer 7c are removed. The width (in the x-axis direction) of the recesses H1 is nearly the same as the width of the base portions 7b12 (the value that subtracted the width K6b from the pitch K6a). The dry-etched resin layer 7c forms a resin layer 7d, and the dry-etched primer 6 forms a primer 6a.

An example of the dry etching process in step S27a is illustrated below. In this dry etching process, RIE is used, for example. The etching gas used in the dry etching process is a gas mixture of $CF_4$ gas and $O_2$ gas. The internal pressure of the chamber is set to be 1 to 5 Pa. The ICP power is set to be 200 to 300 W. The flow rate of the $CF_4$ gas is set to be 50 to 100 sccm. The flow rate of the $O_2$ gas is set to be 5 to 10 sccm. The mixing ratio of the $CF_4$ gas to the $O_2$ gas in the gas mixture used in the dry etching process is controlled so that the etching rate of the resin layer 8b, which is made of a resin containing silicon, is lower than the etching rate of the resin layer 7c, which is made of a resin containing no silicon, and the primer 6. The resin containing silicon that is included in the resin layer 8b reacts with the $O_2$ gas in the gas mixture of $CF_4$ gas and $O_2$ gas to form $SiO_2$. When a resin containing silicon is etched with a gas mixture of $CF_4$ gas and $O_2$ gas, more $SiO_2$ is formed as the proportion of the $O_2$ gas in the gas mixture of $CF_4$ gas and $O_2$ gas is increased. The etching rate of the resin containing silicon (that is, the resin layer 8b) decreases due to the formation of $SiO_2$. Therefore, by adjusting the flow rates of the $CF_4$ gas and the $O_2$ gas in the gas mixture so as to increase the mixing ratio of the $O_2$ gas to the $CF_4$ gas, the etching rate of the resin layer 8b, which is made of a resin containing silicon, is made lower than the etching rate of the resin layer 7c, which is made of a resin containing no silicon, and the primer 6. Thus, in step S27a, the base portions 7b12 and the primer 6 is selectively removed by dry etching using the resin layer 8b as a mask. The etch-back process described above and the process of selectively dry-etching the base portions 7b12 and the primer 6 in step S27a are continuously performed in the same ICP-RIE equipment simply by changing the mixing ratio of the $CF_4$ gas to the $O_2$ gas in the gas mixture. As described above, the etching conditions of the dry etching process in step S27a are set so that the etching rate of the resin layer 8b, which is made of a resin containing silicon, is lower than that of the resin layer 7c (or the base portions 7b12). However, the resin layer 8b, which is made of a resin containing silicon, is also slightly etched, and accordingly the thickness thereof decreases.

After step S27a, in step S27b, as shown in FIG. 7A, the insulating layer 5 is dry-etched using the resin layers 8b and 7d as a mask. The dry-etched insulating layer 5 forms an insulating layer 5a.

An example of the dry etching process in step S27b is illustrated below. In this dry etching process, RIE is used, for example. The etching gas used in the dry etching process is a gas mixture of $CF_4$ gas and $O_2$ gas. The internal pressure of the chamber is set to be 1 to 5 Pa. The ICP power is set to be 200 to 300 W. The flow rate of the $CF_4$ gas is set to be 50 to 100 sccm. The flow rate of the $O_2$ gas is set to be 0.5 to 3 sccm. In the dry etching process in step S27b, the resin layer 8b is also etched, and accordingly the thickness thereof further decreases.

The process of selectively dry-etching the base portions 7b12 and the primer 6 in step S27a described above and the process of dry-etching the insulating layer 5 in step S27b are continuously performed in the same ICP-RIE equipment simply by changing the mixing ratio of the $CF_4$ gas to the $O_2$ gas in the gas mixture.

After step S27b, the resin layer 8b, the resin layer 7d, and the primer 6a are removed. Thereafter, as shown in FIG. 7B, in step S27c, the capping layer 4 and the semiconductor layer 3a are dry-etched using the insulating layer 5a as a mask. The etched capping layer 4 forms a capping layer 4a. Similarly, the etched semiconductor layer 3 forms a semiconductor layer 3a. The semiconductor layer 3a has the through-holes 3a1. The through-holes 3a1 extend to part of the buffer layer 2. The etched buffer layer 2 forms a buffer layer 2a in which the ends of the through-holes 3a1 are located. The through-holes 3a1 in the semiconductor layer 3a have openings Op1. The openings Op1 have the shape corresponding to the end surfaces 7b12a of the base portions 7b12. The width (in the x-axis direction) of the through-holes 3a1 is nearly the same as the width of the base portions 7b12 (the value that subtracted the width K6b from the pitch K6a). The diffraction grating of the semiconductor layer 3a corresponds to the diffraction grating pattern of the resin layer 7b. Specifically, the diffraction grating of the semiconductor layer 3a has the inverse pattern of the projections 7b1 and the recesses 7b2 of the diffraction grating pattern of the resin layer 7b.

An example of the dry etching process in step S27c is illustrated below. In this dry etching process, RIE is used to remove the resin layer 8b, the resin layer 7d, and the primer 6a. The etching gas used in the dry etching process is $O_2$ gas. The resin layer 8b is removed by dry etching with $O_2$ gas alone because the resin layer 8b has been considerably thinned after the etching processes described above and is removed together with the underlying resin layer 7d and primer 6a. If necessary, dry etching for removing the resin layer 8b may be performed. The process of dry-etching the resin layer 8b, the resin layer 7d, and the primer 6a is continuously performed in the same ICP-RIE equipment as used in the dry etching processes in step S27a and S27b described above simply by changing the etching gas. To change the etching gas, step S27b may be followed by a step of stopping the supply of the etching gas and eliminating the residual gas from the ICP-RIE equipment using a vacuum pump. In step S27c, in order to etch the semiconductor layer 3, a dry etching process such as RIE is used. The etching gas used in the dry etching process is a gas mixture of methane ($CH_4$) gas and hydrogen ($H_2$) gas. The process of dry-etching the semiconductor layer 3 is continuously performed in the same ICP-RIE equipment as used in the processes in step S27a and S27b and the process of dry-etching the resin layer 8b, the resin layer 7d, and the primer 6a described above simply by changing the etching gas. To change the etching gas, the step of dry-etching the resin layer 8b, the resin layer 7d, and the primer 6a may be followed by a step of stopping the supply of the etching gas and eliminating the residual gas from the ICP-RIE equipment using a vacuum pump.

Figure 8A:
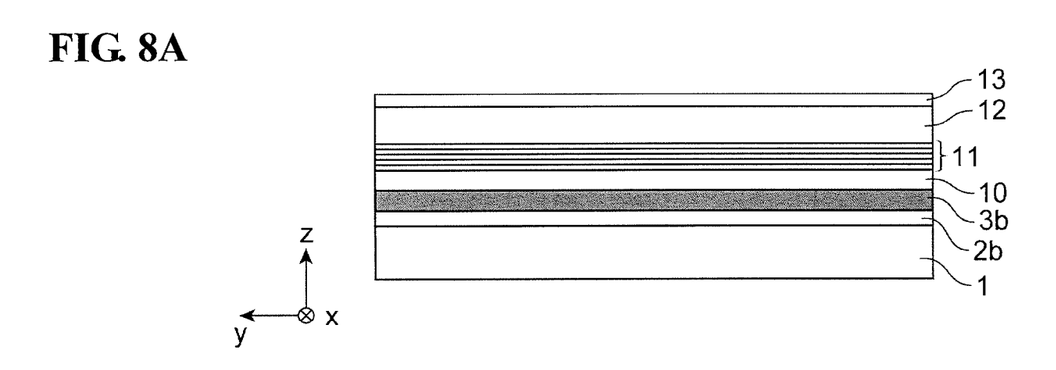
FIGS. 8A and 8B show the internal structure of the product manufactured by the method of manufacture according to the embodiment.

Referring now to FIG. 8A, the process in step S3 shown in FIG. 1 will be described. After step S2, in step S3, the insulating layer 5a is removed. Thereafter, a lower cladding layer 10, an active layer 11, an upper cladding layer 12, and a capping layer 13 are sequentially formed by epitaxial growth. The lower cladding layer 10 is made of a material similar to that of the buffer layer 2a and the capping layer 4a. During the formation of the lower cladding layer 10, the through-holes 3a1 are filled with the material similar to that of the buffer layer 2a and the capping layer 4a by epitaxial growth. The filled buffer layer 2a forms a buffer layer 2b, and the filled semiconductor layer 3a forms a diffraction grating layer 3b. The lower cladding layer 10 is also formed on the surface of the capping layer 4a. Thus, the lower cladding layer 10 is formed on the semiconductor layer 3a and in the through-holes 3a1. The lower cladding layer 10 preferably has a flat surface. This facilitates growth of the active layer 11 on the lower cladding layer 10. The active layer 11 is made of, for example, InGaAsP. The upper cladding layer 12 is made of, for example, InP. The capping layer 13 is made of, for example, InGaAs. The active layer 11 may have, for example, a multi-quantum well (MQW) structure.

FIG. 11A illustrates the structure of the diffraction grating of the diffraction grating layer 3b. The pitch of the diffraction grating of the diffraction grating layer 3b is similar to the pitch K6a. The width of the portions of the InGaAsP layer that define the diffraction grating (the width (in the x-axis direction) of the portions of the semiconductor layer 3a between the adjacent through-holes 3a1) is similar to the width K6b. The width K6b is larger than or similar to the width K1b of the projections of the imprint pattern Pt1 formed on the mold Mo (see FIGS. 4B and 5A). The pitch K6a of the diffraction grating pattern of the resin layer 7b is similar to the pitch K1a of the imprint pattern Pt1. Hence, the duty ratio of the diffraction grating of the semiconductor layer 3b is larger than or similar to the duty ratio of the imprint pattern Pt1. The imprint pattern Pt1 is imprinted on the resin layer 7 by the imprinting process in step S23. The imprint pattern Pt1 is formed on the mold Mo used in the imprinting process in step S23 (see FIG. 11B).

Figure 8B:
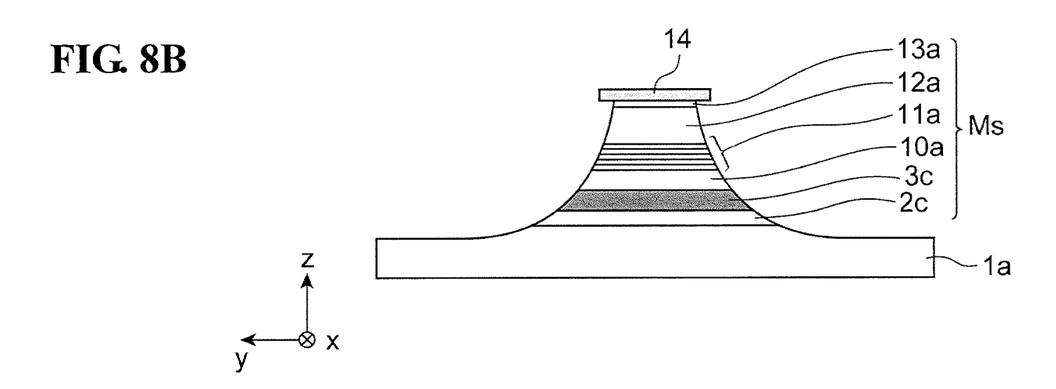

After step S3, as shown in FIG. 8B, a stripe-shaped mesa Ms is formed. A dielectric film 14 is formed on the entire surface of the capping layer 13. The dielectric film 14 is made of, for example, SiN or $SiO_2$. The dielectric film 14 is then processed into a stripe-shaped mask with a width of about 2 μm by using a lithography method and an etching process. The mesa Ms is formed by etching the capping layer 13, the upper cladding layer 12, the active layer 11, the lower cladding layer 10, the diffraction grating layer 3b, the buffer layer 2b, and the substrate 1 using the stripe-shaped dielectric film 14 as a mask. In the etching to form the mesa Ms, a wet etching process is used. In the wet etching process, bromine-methanol is used as an etchant. In this manner, the mesa Ms is formed. The wet-etched substrate 1 forms a substrate 1a. The wet-etched buffer layer 2b forms a buffer layer 2c. The wet-etched diffraction grating layer 3b forms a diffraction grating layer 3c. The wet-etched lower cladding layer 10 forms a lower cladding layer 10a. The wet-etched active layer 11 forms an active layer 11a. The wet-etched upper cladding layer 12 forms an upper cladding layer 12a. The wet-etched capping layer 13 forms a capping layer 13a. The mesa Ms includes the buffer layer 2c, the diffraction grating layer 3c, the lower cladding layer 10a, the active layer 11a, the upper cladding layer 12a, and the capping layer 13a. The stripe-shaped mesa Ms is formed on the substrate 1a and extends in the x-axis direction (waveguide direction). Alternatively, the mesa Ms may be formed by dry etching.

Figure 9A:
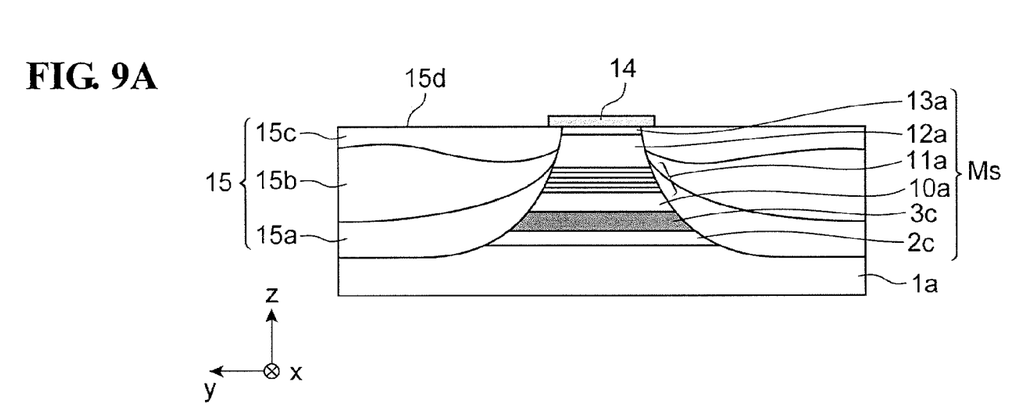
FIGS. 9A and 9B show the internal structure of the product manufactured by the method of manufacture according to the embodiment.

After step S4, in step S5, as shown in FIG. 9A, a buried layer 15 is formed on the substrate 1a and the two side surfaces of the mesa Ms by epitaxial growth. The buried layer 15 includes a semiconductor layer 15a, a semiconductor layer 15b, and a semiconductor layer 15c. The semiconductor layer 15a, the semiconductor layer 15b, and the semiconductor layer 15c are sequentially formed on the substrate 1a by epitaxial growth to bury the side surfaces of the mesa Ms. The semiconductor layer 15a is made of, for example, p-type InP. The semiconductor layer 15b is made of, for example, n-type InP. The semiconductor layer 15c is made of, for example, p-type InP.

Figure 9B:
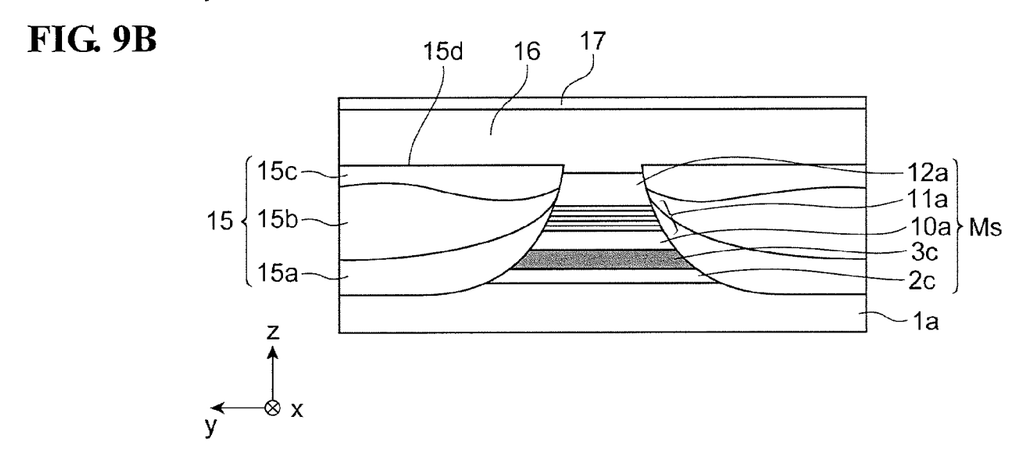

After step S5, the dielectric film 14 is removed. Thereafter, as shown in FIG. 9B, a cladding layer 16 and a contact layer 17 are sequentially formed on a surface 15d by epitaxial growth (step S6). The surface 15d is defined by the surface of the semiconductor layer 15c in the buried layer 15 and the surface of the upper cladding layer 12a in the stripe-shaped mesa Ms. The capping layer 13a is removed before the growth of the cladding layer 16. Thus, the mesa Ms shown in FIG. 9B (the mesa Ms shown in FIGS. 10A and 10B) includes no capping layer 13a. The cladding layer 16 is made of, for example, p-type InP. The contact layer 17 is made of, for example, p-type InGaAs.

Figure 10A:
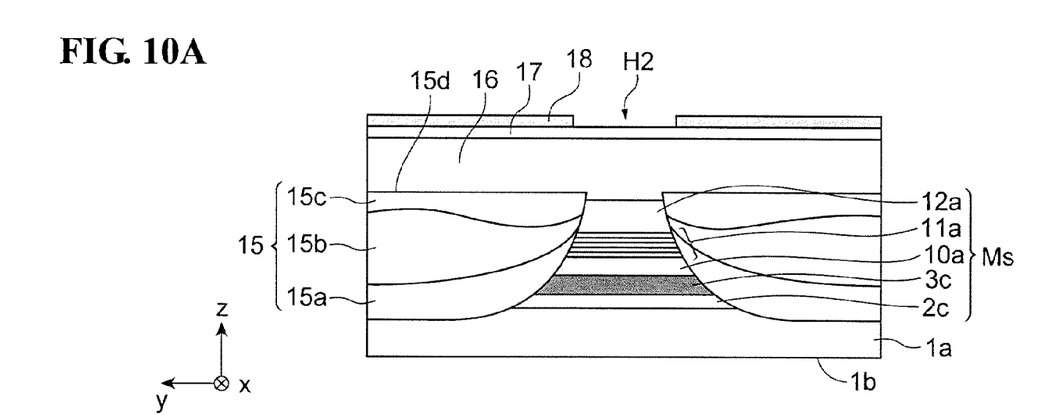
FIGS. 10A and 10B show the internal structure of the product manufactured by the method of manufacture according to the embodiment.
Figure 10B:
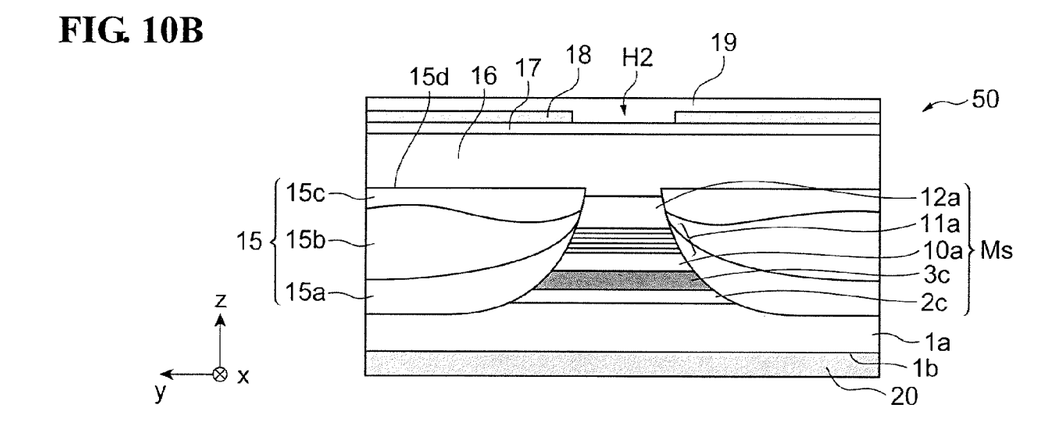

After step S6, in step S7, as shown in FIG. 10A, an insulating layer 18 is formed on the surface of the contact layer 17. For example, an insulating layer is formed on the surface of the contact layer 17, and a stripe-shaped opening (opening H2) is formed in the insulating layer. In addition, the stripe-shaped opening (opening H2) of the insulating layer 18 is formed above the stripe-shaped mesa Ms. In this manner, the insulating layer 18 is formed on the surface of the contact layer 17. The insulating layer 18 is made of, for example, $SiO_2$ or SiN.

After step S7, in step S8, as shown in FIG. 10B, a upper electrode 19 and a lower electrode 20 are formed. The upper electrode 19 is formed on the insulating layer 18. The upper electrode 19 is also formed in the opening H2 in direct contact with the surface of the contact layer 17. The substrate 1a is polished to a thickness of about 100 μm. Then, the lower electrode 20 is formed on the back surface 1b of the substrate 1a. The lower electrode 20 is in contact with the back surface 1b of the substrate 1a. The upper electrode 19 is made of, for example, Au/Ti/Au/Zn/Au. The lower electrode 20 is made of, for example, Au/Ti/Au/AuGeNi.

To form a diffraction grating by nanoimprint lithography, a diffraction grating pattern formed on a mold is accurately transferred to a resin layer, and a semiconductor layer is etched using the resin layer as a mask to form a diffraction grating in the semiconductor layer. In nanoimprint lithography, the pattern formed on the mold is accurately and precisely transferred to the semiconductor layer. In the methods for nanoimprint lithography in the related art, however, it is difficult to change or fine-tune the diffraction grating pattern formed on the mold during the manufacturing process. For example, in some cases, the diffraction grating pattern formed on the mold (e.g., the duty ratio) needs to be adjusted during the manufacturing process taking into account, for example, the variation and reproducibility of nanoimprint lithography and etching processes. In the method for manufacturing the semiconductor laser device 50 according to this embodiment, the duty ratio can be adjusted in step S24. Therefore, even if the mold has a single duty ratio, it can be used to form diffraction gratings with different duty ratios. In addition, if the mold has a single duty ratio, it can be designed to have more pitches than a mold having a plurality of duty ratios. Whereas the methods in the related art require a plurality of molds to be prepared depending on the types of duty ratios and pitches, the method for manufacturing a semiconductor laser device according to this embodiment may use a mold having diffraction grating patterns with a single duty ratio, and the duty ratio can be adjusted after the diffraction grating patterns of the mold are transferred to a resin layer. Thus, the method according to this embodiment requires fewer molds to be prepared and therefore involves a lower cost for mold fabrication than the methods in the related art. The method according to this embodiment also allows design changes because the duty ratio of a diffraction grating formed in a semiconductor layer can be adjusted irrespective of the duty ratio of the mold.

In the etch-back step, the resin layers 8 and 7b are etched back until the top portions 7b11, which have the curved surfaces, are removed. In addition, the base portions 7b12, which have the side surfaces 7b12b perpendicular to the reference plane Sf, remain (see FIGS. 6A and 6B). More specifically, at least the regions of the side surfaces 7b12b adjacent to the end surfaces 7b12a of the base portions 7b12 extend perpendicular to the reference plane Sf. Thus, the width (in the x-axis direction) of the end surfaces 7b12a of the base portions 7b12 is uniform. Because the diffraction grating is defined by the side surfaces 7b12b, the base portions 7b12, having a uniform width, allow the diffraction grating to have a sufficiently uniform pitch.

Although this embodiment illustrates the case where a diffraction grating is formed in the semiconductor layer 3 formed on the substrate 1, it may be formed in other layers. For example, a diffraction grating can be formed in a silicon layer or a $SiO_2$ layer formed on a silicon substrate by the method according to this embodiment.

The height from the bottom surfaces 7a21 of the recesses 7a2 of the imprint pattern Pt1 to the insulating layer 5 (i.e., the sum of the thickness K3 and the thickness K4) is larger than the thickness K5 by which the resin layer 7a is etched when the duty ratio is changed in step S24. Accordingly, after the duty ratio is adjusted, the primer 6 remains at least partially on the insulating layer 5. Thus, the height of the projections 7b1 after the adjustment of the duty ratio is similar to the height K2 of the projections 7a1 before the adjustment of the duty ratio. When used as a mask, therefore, the resin layer 7b functions well as a mask. In addition, the side surfaces 7b12b of the base portions 7b12 of the projections 7b1 have a sufficient height in the direction perpendicular to the reference plane Sf. For example, the regions of the side surfaces 7b12b perpendicular to the reference plane Sf have a height (in the z-axis direction) of about 50 nm. Because the diffraction grating is defined by the side surfaces 7b12b, which have a sufficient height, they allow the diffraction grating to have a sufficiently uniform pitch.

Although the principle of the present invention has been illustrated and described with reference to preferred embodiments, those skilled in the art will recognize that changes in configuration and details can be made without departing from the principle of the present invention. Accordingly, the present invention is not limited to the particular structures disclosed in the embodiments, but includes all modifications and changes that fall within the spirit and scope of the claims.

What is claimed is:

1. A method for manufacturing a semiconductor optical device, comprising the steps of:
    preparing a mold having an imprint pattern including periodic projections and recesses;
    forming a substrate product including a semiconductor layer that extends along a reference plane;
    forming a first resin layer on the semiconductor layer;
    forming a diffraction grating pattern having periodic projections and recesses in the first resin layer by transferring the imprint pattern using the mold by nanoimprint lithography, the projection of the diffraction grating pattern having a top portion and a base portion;
    changing a duty ratio of the diffraction grating pattern in the first resin layer by dry-etching the first resin layer;
    forming a second resin layer on the first resin layer so as to cover the projection and the recess of the diffraction grating pattern in the first resin layer;
    removing the top portion of the projection of the diffraction grating pattern by etching back the first resin layer and the second resin layer while leaving the base portion of the projection, the second resin layer being left in the recess of the first resin layer;
    selectively etching the first resin layer through the second resin layer left in the recess of the first resin layer, the first resin layer having a reverse pattern to the diffraction grating pattern; and
    etching the semiconductor layer through the first resin layer having the reverse pattern to the diffraction grating pattern to form a diffraction grating.

2. The method for manufacturing a semiconductor optical device according to claim 1, wherein, in the step of removing the top portion of the projection, the base portion of the projection includes an end surface disposed between the base portion and the top portion and a side surface, and
    the side surface has a region adjacent to the end surface that extends substantially perpendicular to the reference plane.

3. The method for manufacturing a semiconductor optical device according to claim 1, further comprising a step of forming an insulating layer on the semiconductor layer,
    wherein the first resin layer is formed on the insulating layer, and
    in the step of forming the diffraction grating pattern in the first resin layer, the diffraction grating pattern has a height measured from a bottom surface of the recess to a surface of the insulating layer, the height being larger than a thickness by which the first resin layer is etched in the step of changing the duty ratio of the diffraction grating pattern.

4. The method for manufacturing a semiconductor optical device according to claim 1, wherein the first resin layer is composed of a resin containing no silicon,
    the second resin layer is composed of a resin containing silicon, and
    in the step of selectively etching the first resin layer, the first resin layer is etched by reactive ion etching with a gas mixture of tetrafluoromethane ($CF_4$) gas and oxygen ($O_2$) gas.

5. The method for manufacturing a semiconductor optical device according to claim 4, wherein the step of removing the top portion of the projection and the step of selectively etching the first resin layer are continuously performed by changing a mixing ratio of the $CF_4$ gas to the $O_2$ gas in the gas mixture.

6. The method for manufacturing a semiconductor optical device according to claim 1, further comprising a step of forming an insulating layer on the semiconductor layer, wherein the first resin layer is formed on the insulating layer,
    in the step of selectively etching the first resin layer, the first resin layer is etched until the insulating layer is exposed,
    the insulating layer is etched using the first resin layer having the reverse pattern to the diffraction grating pattern as a mask, and
    after removing the first resin layer, the semiconductor layer is etched using the insulating layer as a mask in the step of etching the semiconductor layer.

7. The method for manufacturing a semiconductor optical device according to claim 1, wherein, in the step of changing the duty ratio of the diffraction grating pattern, the first resin layer is dry-etched by reactive ion etching using $O_2$ gas as an etching gas.

8. The method for manufacturing a semiconductor optical device according to claim 1, wherein the imprint pattern of the mold includes a plurality of grating patterns having different pitches, the grating patterns having a single duty ratio.

9. The method for manufacturing a semiconductor optical device according to claim 1, further comprising a step of forming a lower cladding layer, an active layer, and an upper cladding layer on the diffraction grating formed in the semiconductor layer after the step of etching the semiconductor layer.

* * * * *